(12) United States Patent
Miki

(10) Patent No.: US 7,990,148 B2
(45) Date of Patent: Aug. 2, 2011

(54) COOLED NMR PROBE HEAD AND NMR ANALYZER

(75) Inventor: Takashi Miki, Kobe (JP)

(73) Assignee: Kobe Steel Ltd., Hyogo (JP)

( * ) Notice: Subject to any disclaimer, the term of this patent is extended or adjusted under 35 U.S.C. 154(b) by 174 days.

(21) Appl. No.: 12/310,010

(22) PCT Filed: Aug. 10, 2007

(86) PCT No.: PCT/JP2007/065748
§ 371 (c)(1),
(2), (4) Date: Feb. 6, 2009

(87) PCT Pub. No.: WO2008/020576
PCT Pub. Date: Feb. 21, 2008

(65) Prior Publication Data
US 2009/0322333 A1 Dec. 31, 2009

(30) Foreign Application Priority Data
Aug. 17, 2006 (JP) .................................. 2006-222252

(51) Int. Cl.
*G01V 3/00* (2006.01)
(52) U.S. Cl. ........................................ 324/321; 324/318
(58) Field of Classification Search .................. 324/321, 324/318
See application file for complete search history.

(56) References Cited

U.S. PATENT DOCUMENTS

| | | | |
|---|---|---|---|
| 5,247,256 A | | 9/1993 | Marek |
| 5,508,613 A | * | 4/1996 | Kotsubo et al. ............... 324/318 |
| 5,530,353 A | | 6/1996 | Blanz |
| 5,913,888 A | | 6/1999 | Steinmeyer et al. |
| 6,833,701 B2 | * | 12/2004 | Marek ........................... 324/307 |
| 6,914,430 B2 | * | 7/2005 | Hasegawa et al. ............. 324/315 |
| 2004/0004478 A1 | | 1/2004 | Hofmann et al. |

FOREIGN PATENT DOCUMENTS

| | | |
|---|---|---|
| JP | 4-230880 | 4/1991 |
| JP | 10-155771 | 11/1997 |
| JP | 2004-233337 | 12/2003 |

OTHER PUBLICATIONS

International Search Report of PCT/JP2007/065748 mailed Nov. 13, 2007.

* cited by examiner

*Primary Examiner* — Louis M Arana
(74) *Attorney, Agent, or Firm* — Stites & Harbison PLLC; Juan Carlos A. Marquez, Esq.

(57) ABSTRACT

An object of the present invention is to provide a cooled NMR probe including an antenna coil and capable of decreasing an operation temperature of the antenna coil by effectively cooling the antenna coil, thereby increasing detection sensitivity of an NMR signal. To attain this, a probe head according to the present invention includes a coil support member which supports the antenna coil, and a cooling member arranged around at least a portion of the coil support member, the cooling member providing a cooling space between the cooling member and the coil support member, the cooling space allowing a refrigerant to circulate therethrough. The cooling member is coupled to the coil support member such that the refrigerant flowing in the cooling space directly contacts an outer peripheral surface of the coil support member.

9 Claims, 14 Drawing Sheets

US 7,990,148 B2

COOLED NMR PROBE HEAD AND NMR ANALYZER

TECHNICAL FIELD

The present invention relates to an NMR (nuclear magnetic resonance) analyzer used for chemical analysis or the like, and to a cooled NMR probe head used for detection of an NMR signal in the analyzer.

BACKGROUND ART

As means for detecting an NMR signal, an NMR probe head including an NMR antenna coil has been known. The NMR antenna coil, which is typically cylindrical, irradiates a sample inserted therein with a RF (radio frequency) pulse, and picks up a magnetic resonance signal radiated from the sample when a predetermined period of time has elapsed since the irradiation. The NMR signal thusly detected is very weak, and hence it is necessary to increase detection sensitivity.

A technique has been developed as a method for increasing the detection sensitivity, the technique which reduces thermal noise by cooling the antenna coil with a refrigerant such as helium to a cryogenic temperature. Referring to Expression (1) given below, the S/N ratio (SNR) of an NMR signal is inversely proportional to the square root of a value including the product of a temperature Tc and a resistance Rc of the antenna coil. The cooling the antenna coil markedly increases the detection sensitivity of an NMR signal.

$$SNR \propto 1/\sqrt{[TcRc+TsRs+Ta(Rc+Rs)^2]} \qquad (1)$$

where Ts is a temperature of a sample to be a measurement subject, Rs is an effective resistance of the sample, and Ta is a temperature of a preamplifier that amplifies a signal.

Patent Document 1 discloses, as means for cooling the antenna coil, a probe head including a cylindrical thermal conductor that supports the antenna coil, and a heat exchanger that is fed by helium gas cooled by a GM refrigerator. More specifically, FIG. 2 in Patent Document 1 shows a structure in which a lower end of the thermal conductor is coupled to an upper surface of the heat exchanger in an upstanding state.

Obviously from aforementioned Expression (1), the temperature of the antenna coil is preferably as cold as possible to increase the S/N ratio of an NMR signal. However, with the conventional cooled NMR probe head disclosed in Patent Document 1, the antenna coil is operated at temperatures in a range of from 20K to 25K. Such temperatures define the cooling limit. The reason is given below.

As described above, the NMR antenna coil typically serves as both NMR detection and RF transmission coils. Thus, the NMR antenna coil receives electrical power for measurement. The electrical power is partly consumed as Joule heat in the antenna coil; increasing the temperature of the coil. Meanwhile, the specific heat of metal (for example, copper or aluminum), which forms the antenna coil, is significantly small in a temperature range below the range of from 20K to 25K. Hence, even very small Joule heat significantly increases the temperature of the antenna coil. In addition, the electrical resistance of copper or aluminum, which is the material of the antenna coil, increases as the temperature of the material increases. The increase in the electrical resistance promotes an increase in temperature of the antenna coil due to the Joule heat. The electrical resistance may be suppressed to a very small resistance, called remnant resistance, in a low temperature range around a range of from 10K to 20K. In a higher temperature range than that temperature range, for example, in the operation temperature range (from 20K to 25K) of the conventional antenna coil, the electrical resistance rapidly increases as the temperature increases.

Patent Document 1: Specification and Drawings of US Patent Application Publication No. 2004/0004478

DISCLOSURE OF INVENTION

In light of the above situations, an object of the present invention is to provide a cooled NMR probe capable of decreasing the operation temperature of an antenna coil by effectively cooling the antenna coil, thereby increasing detection sensitivity of an NMR signal. To attain this, a cooled NMR probe head according to the present invention includes a coil support member which supports the antenna coil, and a cooling member arranged around at least a portion of the coil support member, the cooling member providing a cooling space between the cooling member and the coil support member, the cooling space allowing a refrigerant to circulate therethrough. The cooling member is coupled to the coil support member such that the refrigerant flowing in the cooling space directly contacts an outer peripheral surface of the coil support member.

With the NMR probe head, the cooling space is provided between the coil support member and the cooling member, and the refrigerant circulating through the cooling space directly contacts the outer peripheral surface of the coil support member. Accordingly, the refrigerant highly efficiently exchanges heat with the coil support member, thereby effectively cooling the antenna coil supported by the coil support member.

BEST MODES FOR CARRYING OUT THE INVENTION

Preferred embodiments of the present invention are described below with reference to the drawings.

Figure 1:
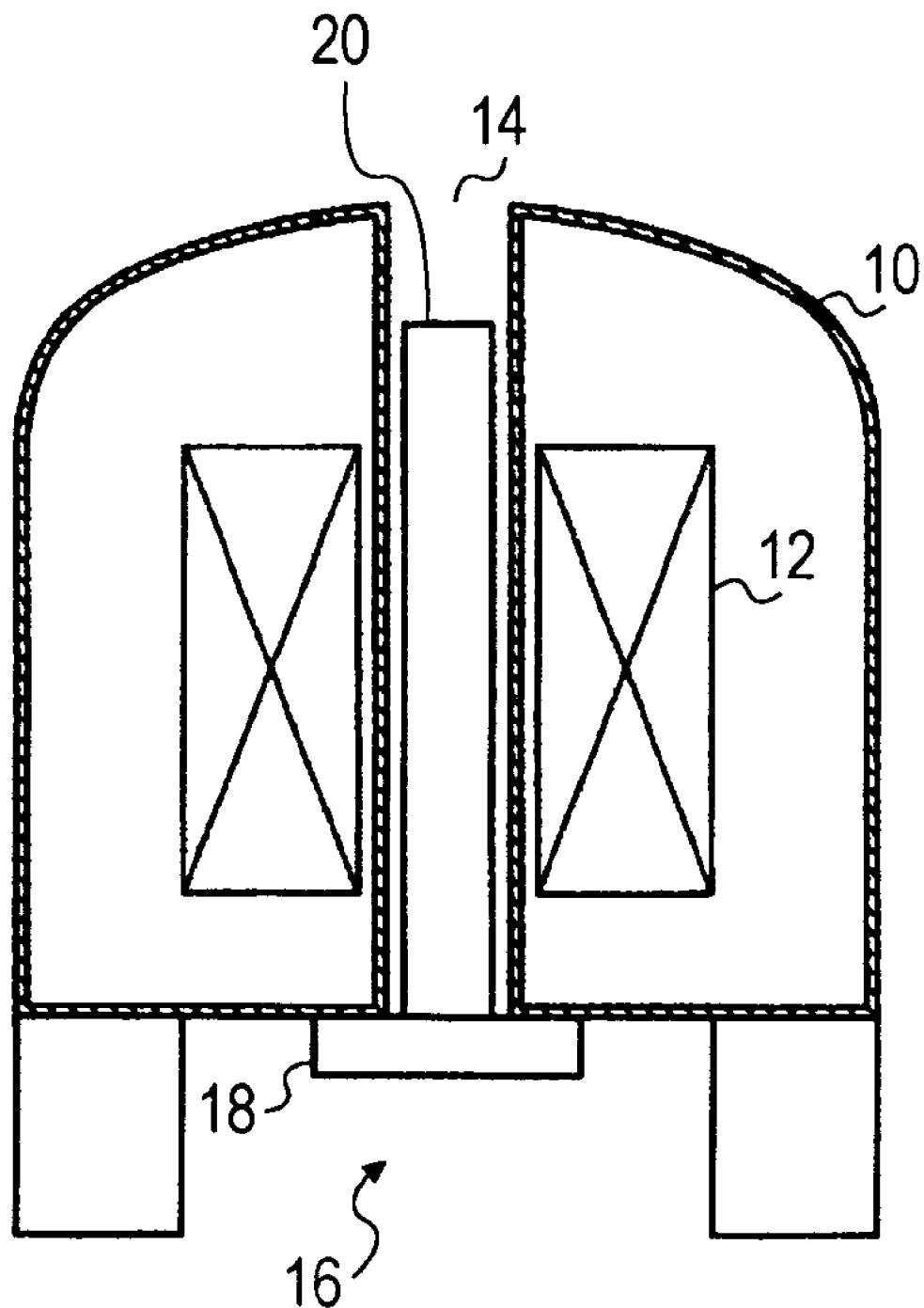
FIG. 1 is a sectional front view showing an NMR analyzer according to an embodiment of the present invention.

FIG. 1 shows the overall configuration of an NMR (nuclear magnetic resonance) analyzer. The analyzer includes a cryogenic container 10 which contains a refrigerant such as liquid helium, a superconducting coil 12 immersed in the refrigerant, and a cooled NMR probe head 16. The superconducting coil 12 includes a cylindrical core centering at the vertical axis and superconducting wires wound around the core. The cryogenic container 10 has a doughnut-like shape to cover the superconducting coil 12 from the inside in a radial direction of the superconducting coil 12. That is, a vertically extending inner space 14 is provided at the center of the cryogenic container 10.

The cooled NMR probe head 16 is inserted into the inner space 14 from the lower side. The cooled NMR probe head 16 includes an electrode portion 18 and a columnar probe body 20 connected to the electrode portion 18. The probe body 20 is inserted into the inner space 14 from the lower side.

Figure 2:
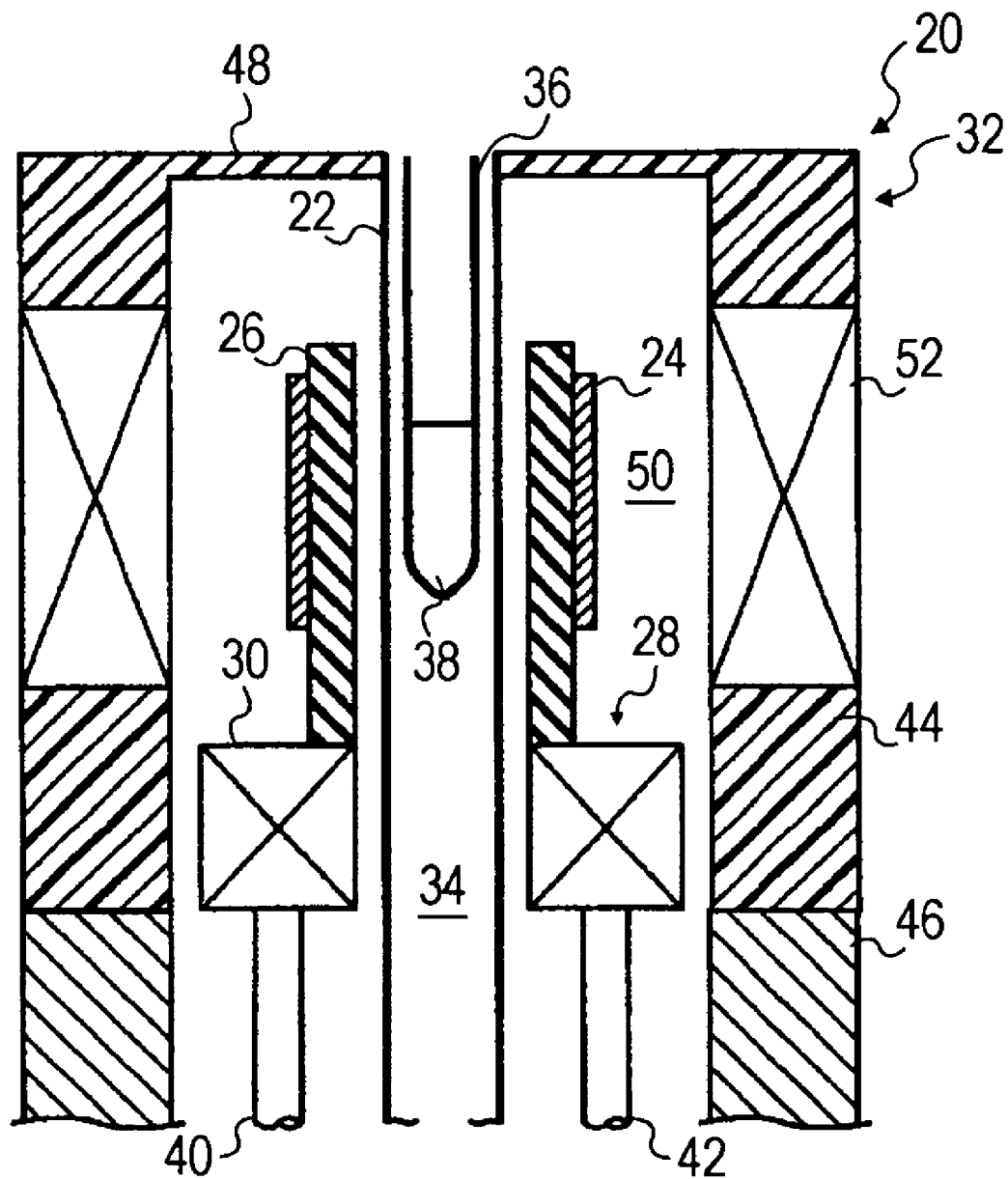
FIG. 2 is a sectional front view showing an NMR probe which is installed in the NMR analyzer.

FIG. 2 shows the inner structure of an upper portion of the probe body 20. The probe body 20 includes a sample insertion tube 22 located on the central axis of the probe body 20, a substantially cylindrical antenna coil 24 surrounding the sample insertion tube 22, a coil support member 26 for supporting the antenna coil 24, a cooling member 30, and a cylindrical outer casing 32. The coil support member 26 and the cooling member 30 define a cooling stage 28.

The sample insertion tube 22 is made of, for example, quartz, and has therein a space 34 maintained at ordinary temperatures and pressures. A sample tube 36 is inserted into the space 34 from the upper side. The sample tube 36 contains a sample 38 to be a subject of NMR analysis.

The antenna coil 24 has a substantially cylindrical peripheral wall. For example, the peripheral wall is formed by rounding a metal film. The shape of the antenna coil 24 is not particularly limited, and may be appropriately determined depending on the frequency of a RF pulse to be used for NMR detection and other specifications.

The coil support member 26 is cylindrical in this embodiment, and is arranged coaxially with the sample insertion tube 22. An upper portion of the coil support member 26 supports the antenna coil 24. More specifically, an inner peripheral surface of the antenna coil 24 is joined to an outer peripheral surface of the upper portion of the coil support member 26.

Figure 3:
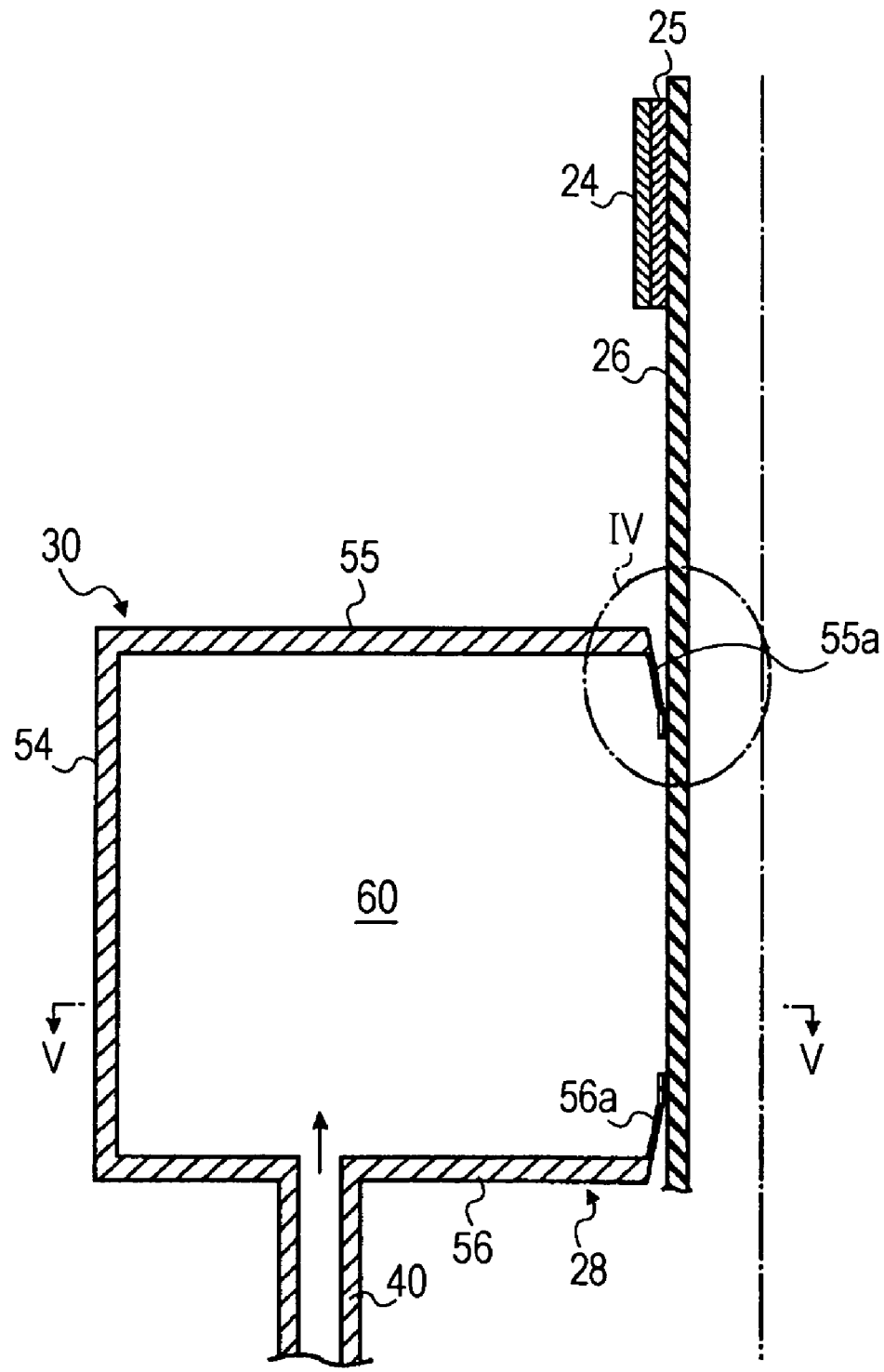
FIG. 3 is a sectional front view showing a first embodiment of a specific structure of the NMR probe head.

Referring to FIG. 3, the cooling member 30 is arranged to cover a lower portion of the coil support member 26. The cooling member 30 and the coil support member 26 define the cooling stage 28. The cooling stage 28 is hollow. A refrigerant inlet tube 40 and a refrigerant outlet tube 42 shown in FIG. 2 are connected to the cooling stage 28. The refrigerant inlet tube 40 introduces a refrigerant such as helium gas cooled by a refrigerator (not shown) into the cooling stage 28. The refrigerant outlet tube 42 discharges the refrigerant in the cooling stage 28 to the outside of the system. That is, the refrigerant flows through the cooling stage 28. The refrigerant effectively cools the coil support member 26 and the antenna coil 24 which is joined to the coil support member 26. This will be described later in detail.

The cylindrical outer casing 32 is arranged to surround the coil support member 26 and the cooling stage 28 from the outside in the radial direction. The cylindrical outer casing 32 includes an upper cylindrical portion 44 provided in a height region surrounding the coil support member 26 and the cooling stage 28, and a lower cylindrical portion 46 located below that region. The lower cylindrical portion 46 is formed of a metal material, such as an aluminum alloy or stainless steel, whereas the upper cylindrical portion 44 is formed of a non-metal material such as synthetic resin.

A top wall 48 extends from an upper end of the upper cylindrical portion 44 toward the inside. The top wall 48 is connected to an upper end of the sample insertion tube 22 while covering the antenna coil 24 and the coil support member 26 from the upper side, and thus the top wall 48 isolates a space 50 defined below the top wall 48 from the outside. The space 50 is evacuated with a pump (not shown). That is, the antenna coil 24 and other components are arranged in the vacuum space 50.

A portion of the upper cylindrical portion 44 corresponding to the height region, in which the antenna coil 24 is included, is formed of a PFG coil 52 instead of the above-mentioned resin. The PFG coil 52 applies a gradient magnetic field in a pulse form to the sample 38 in the sample tube 36. The PFG coil 52 is not essential to the present invention. The PFG coil 52 may be molded with the resin which forms the residual portion of the upper cylindrical portion 44.

Next, various preferred embodiments for the specific structure of the coil support member 26 and the cooling member 30 are described with reference to FIGS. 3 to 17.

Figure 4:
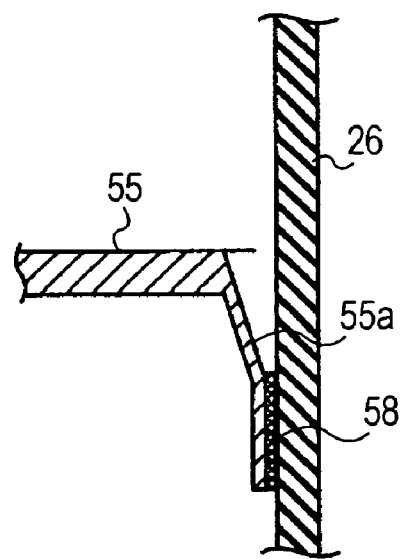
FIG. 4 is an enlarged view showing part IV in FIG. 3.
Figure 5:
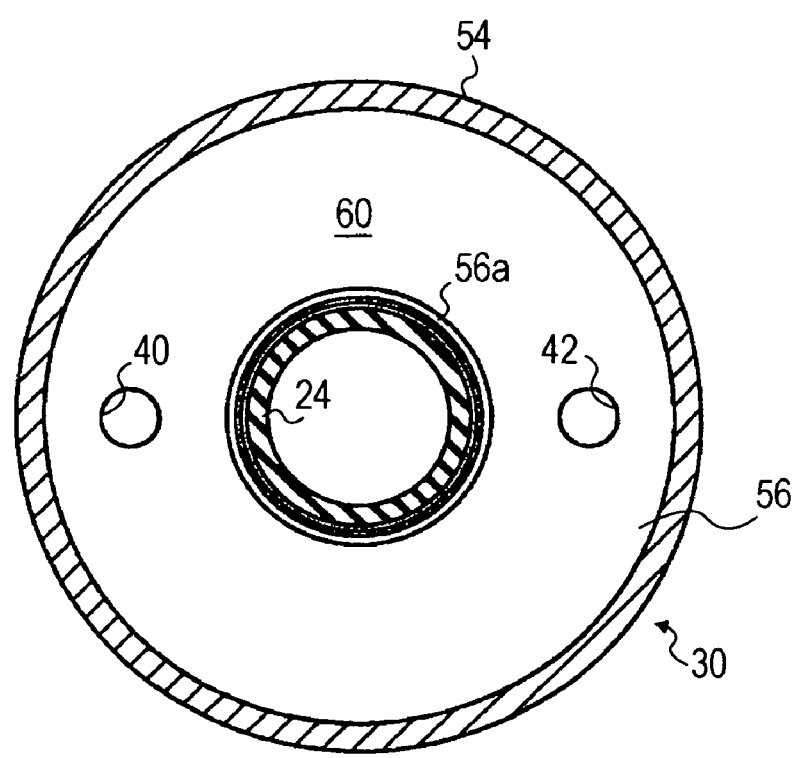
FIG. 5 is a sectional view taken along line V-V in FIG. 3.
Figure 6:
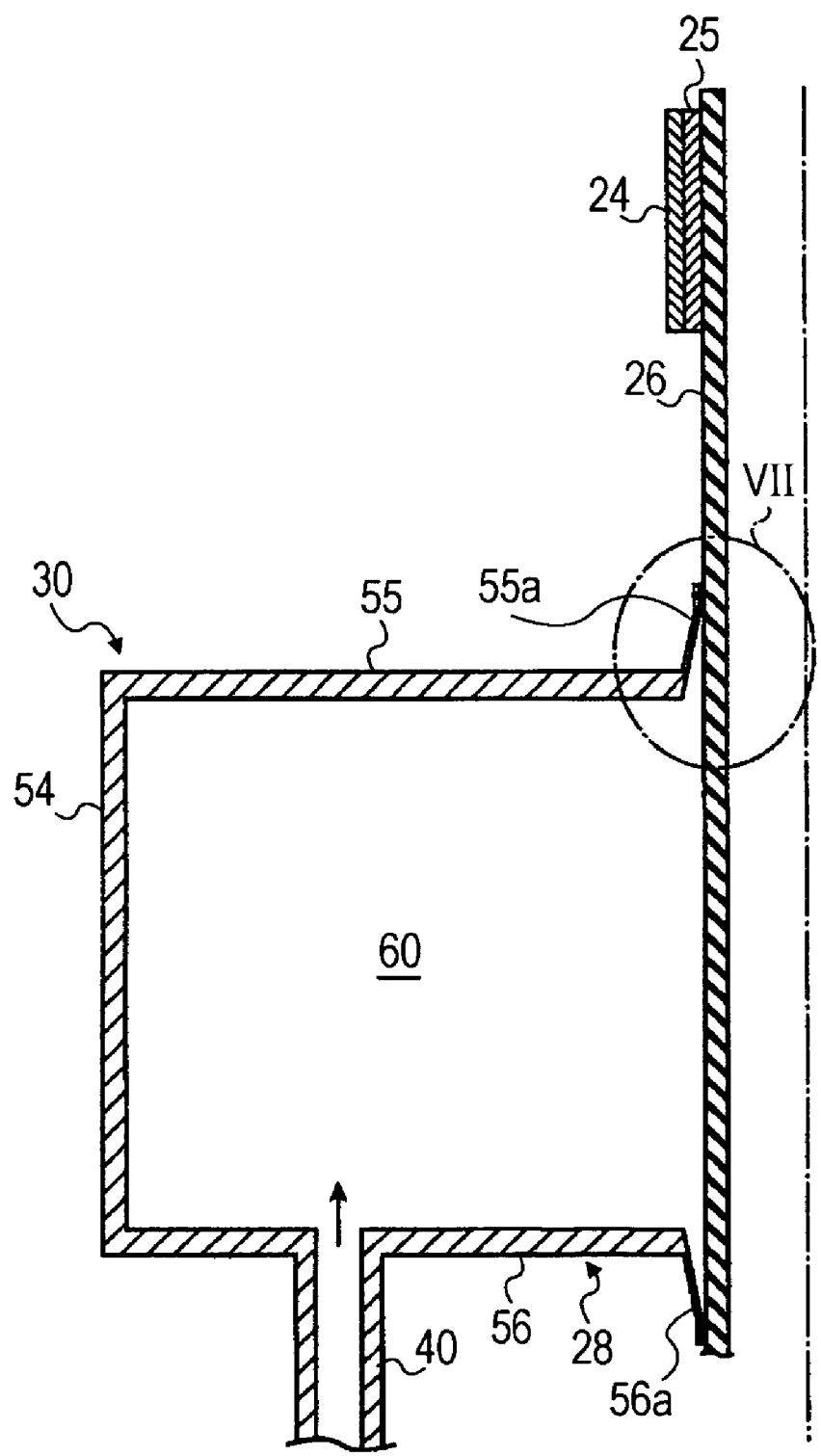
FIG. 6 is a sectional front view showing a second embodiment of a specific structure of the NMR probe head.
Figure 7:
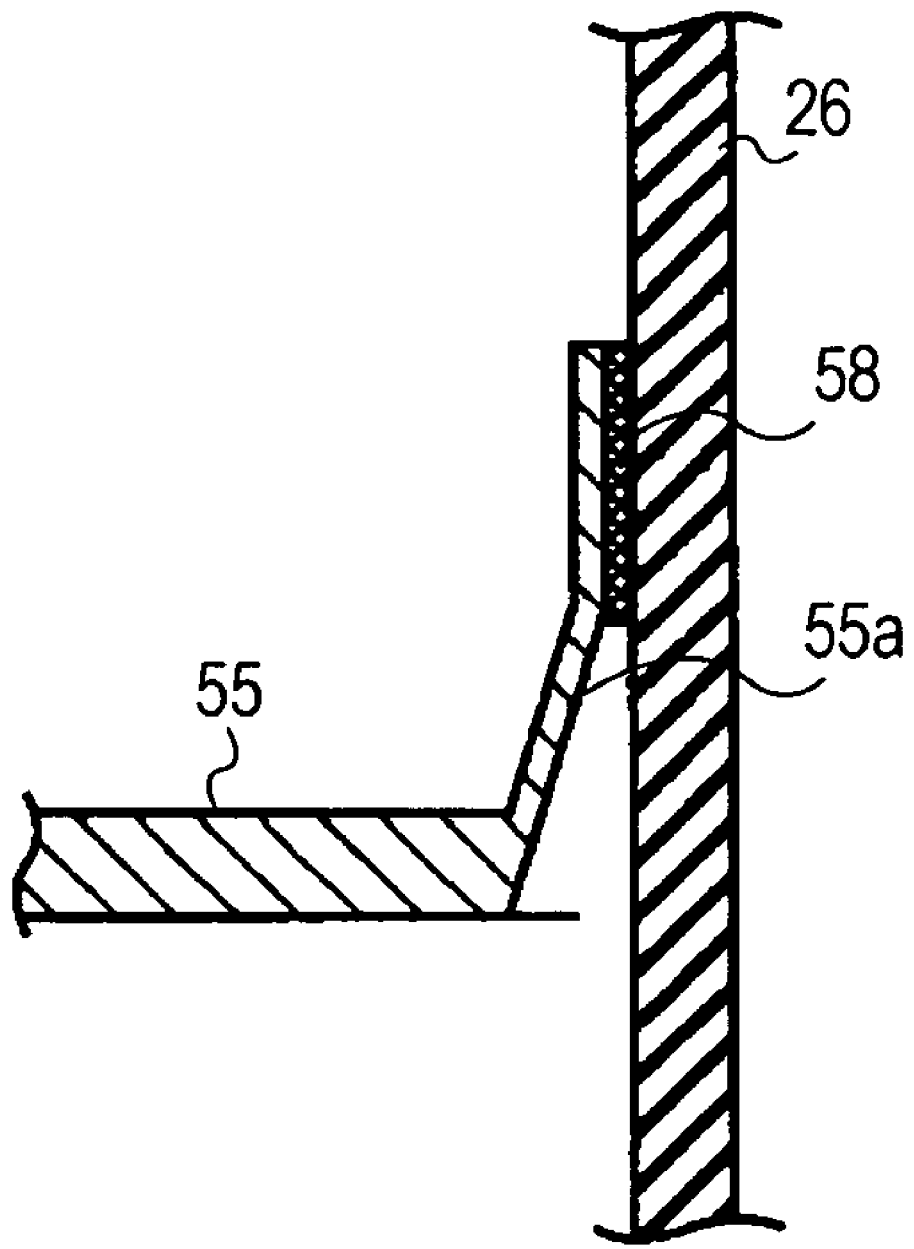
FIG. 7 is an enlarged view showing part VII in FIG. 6.

In a first embodiment shown in FIGS. 3 to 5, an upper portion of the coil support member 26 supports the antenna coil 24. Also, a lower half portion of the coil support member 26 and the cooling member 30 define the cooling stage 28.

The coil support member 26 is formed of an insulating material that transmits electromagnetic waves, so as to prevent detection of an NMR signal with the antenna coil 24 from being adversely affected by the presence of the coil support member 26. The material of the coil support member 26 is more preferably a material with good thermal conductivity. More specifically, for example, the material may be preferably single-crystal sapphire, zirconia ($ZrO_2$ or the like), quartz, or diamond. In particular, single-crystal sapphire has a good thermal conductivity in a cryogenic temperature range, and hence makes a significant contribution to effective cooling of the antenna coil 24. The thermal conductivity of single-crystal sapphire at 4.2K is 251 [W/K/m], and the thermal conductivity thereof at 10K is 2870 [W/K/m].

For example, referring to FIG. 3, the coil support member 26 and the antenna coil 24 may be joined by brazing using a joint material 25 as a medium. In particular, when the coil support member 26 is made of single-crystal sapphire, the joint material 25 for joining the coil support member 26 and the antenna coil 24 made of metal (aluminum or copper) may be preferably a joint material called active silver-alloy, such as an Ag—Cu alloy containing Ti.

The cooling member 30 is entirely formed of a metal material such as copper, and is integrally formed with the refrigerant inlet tube 40 and the refrigerant outlet tube 42. The cooling member 30 has a shape covering an outer peripheral surface of the lower half portion of the coil support member 26 to extend along the entire periphery from the outside in the radial direction. The cooling member 30 and the coil support member 26 define the cooling stage 28 surrounding the doughnut-like cooling space 60.

Specifically, the cooling member 30 includes an outer peripheral wall 54, an upper lid 55, and a lower lid 56, which are integrally formed. The outer peripheral wall 54 is arranged at the outside of the coil support member 26 in the radial direction so as to surround the lower half portion of the coil support member 26. The upper lid 55 and the lower lid 56 have disk-like shapes which cover the space defined between an inner surface of the outer peripheral wall 54 and the outer peripheral surface of the coil support member 26 from the upper and lower sides, respectively. Inner ends of the lids 55 and 56 in the radial direction are joined to the outer peripheral surface of the coil support member 26.

The upper lid 55 has a body portion, and a thin flexible portion 55a extending obliquely downward from the body portion toward the inside in the radial direction. That is, the inner end of the upper lid 55 in the radial direction defines the flexible portion 55a. A lower end portion of the flexible portion 55a can be bent in the radial direction of the coil support member 26. An inner surface of the lower end portion is joined to the outer peripheral surface of the coil support member 26 with a joint material 58 which is similar to the joint material 25 (FIG. 4). Similarly, the lower lid 56 has a body portion, and a thin flexible portion 56a extending obliquely downward from the body portion toward the inside in the radial direction. That is, an inner end of the lower lid 56 in the radial direction defines the flexible portion 56a. An upper end portion of the flexible portion 56a can be bent in the radial direction of the coil support member 26. An inner surface of the upper end portion is joined to the outer peripheral surface of the coil support member 26 with a joint material which is similar to the joint material 58. The bending properties of the flexible portions 55a and 56a absorb relative displacements of the coil support member 26 and the cooling member 30 in the radial direction.

Both the refrigerant inlet tube 40 and the refrigerant outlet tube 42 are connected to the lower lid 56. Accordingly, the refrigerant is introduced into the cooling space 60 from the lower side and is discharged from the cooling space 60 to the lower side.

In the first embodiment, the lower half portion of the coil support member 26 and the cooling member 30 surround the cooling space 60 through which the refrigerant circulates. Hence, the refrigerant can directly contact the coil support member. Accordingly, for example, as compared with a structure in which a lower end portion of the coil support member 26 is joined to an outer surface of the cooling member 30, the refrigerant can cool the coil support member 26 markedly highly efficiently, and hence the temperature of the antenna coil 24 joined to the coil support member 26 can be decreased to extremely low temperatures. For example, when liquid helium at 4.2K is used as the refrigerant, the temperature of the antenna coil 24 can be decreased to temperatures at 6K or lower.

The cooling causes a difference to be generated between a thermal contraction of the coil support member 26 and that of the cooling member 30 on account of differences in properties of the materials. For example, when the coil support member 26 is made of single-crystal sapphire, its linear expansion coefficient at an ordinary temperature ranges from $5 \times 10^{-6}$[1/K] to $5.8 \times 10^{-6}$[1/K]. In contrast, when the cooling member 30 is made of copper, its linear expansion coefficient is $33 \times 10^{-6}$[1/K] that is much larger than the former linear expansion coefficient. Herein, the bending of the flexible portions 55a and 56a absorbs the difference in the thermal contractions, and effectively prevents a thermal stress from being generated due to the difference in the thermal contractions.

The directions of the flexible portions 55a and 56a are not particularly limited. As illustrated in a second embodiment in FIGS. 6 and 7, the flexible portion 55a may extend upward and the flexible portion 56a may extend downward. With this configuration, the difference in the thermal contractions can be still absorbed.

Figure 8:
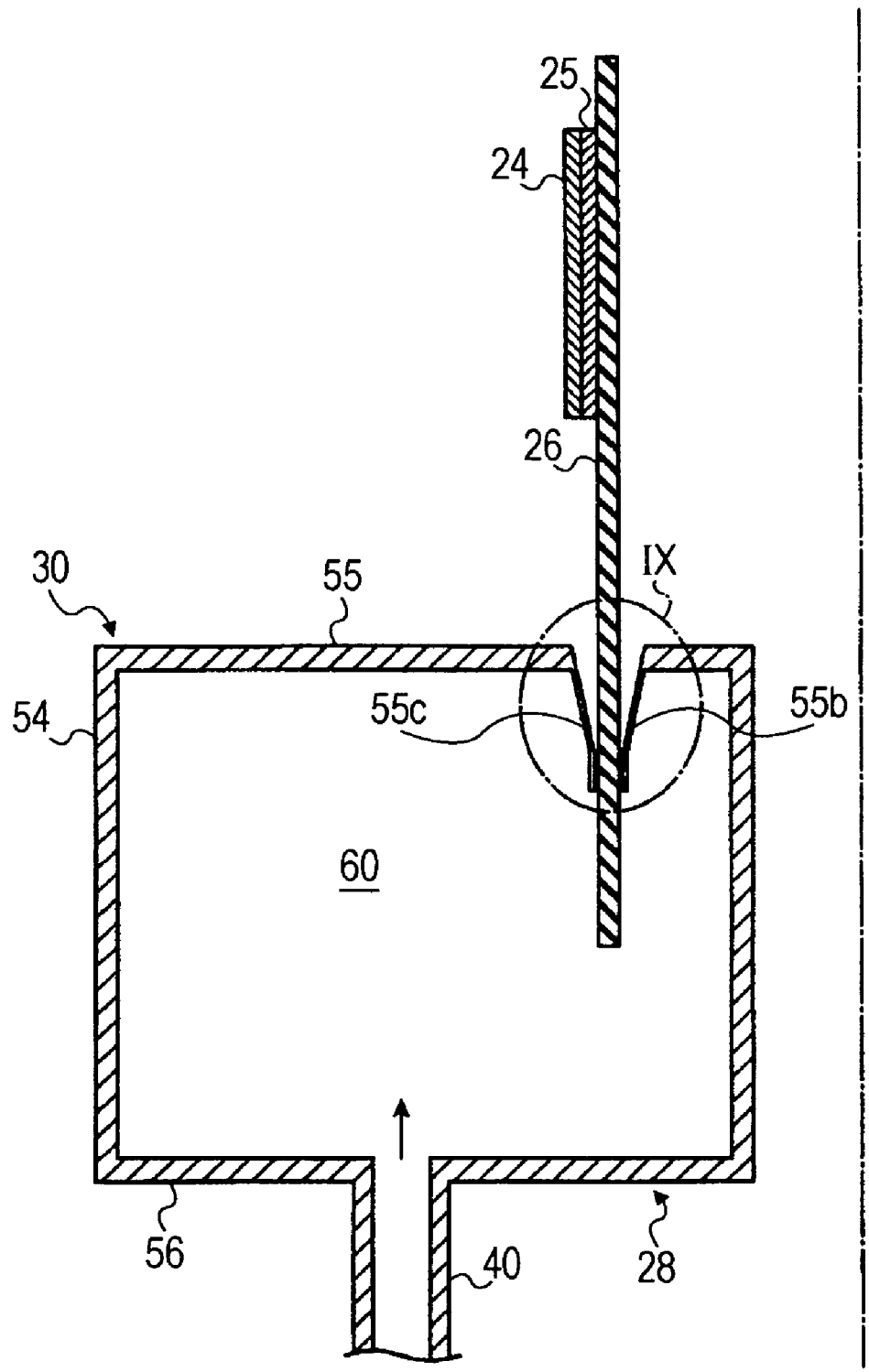
FIG. 8 is a sectional front view showing a third embodiment of a specific structure of the NMR probe head.
Figure 9:
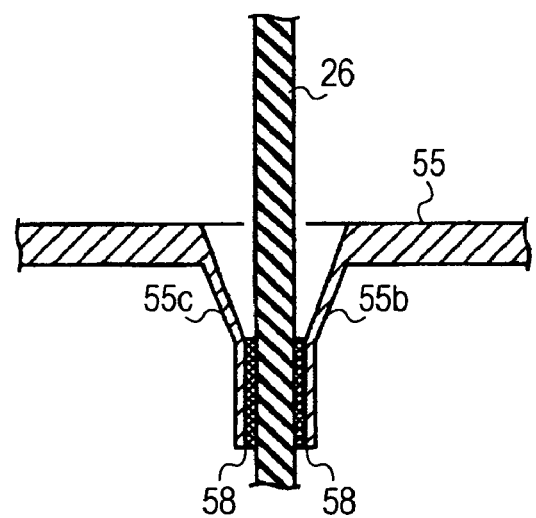
FIG. 9 is an enlarged view showing part IX in FIG. 8.

FIGS. 8 and 9 show a third embodiment, in which a lower portion of the coil support member 26 penetrates through an intermediate portion in the radial direction of the upper lid 55 and is inserted into the inside of the upper lid 55 from the upper side. In this embodiment, the lower portion of the coil support member 26 is covered with the cooling member 30 from the outside and inside in the radial direction, and hence, directly contacts a refrigerant flowing in a cooling space 60.

In the third embodiment, the upper lid 55 includes an upper lid body and a pair of inner and outer thin flexible portions 55b and 55c. The flexible portions 55b and 55c extend downward from the upper lid body. The flexible portions 55b and 55c are arranged opposite to each other, and are respectively joined to inner and outer surfaces of the coil support member 26 via joint materials 58. Bending of the flexible portions 55b and 55c can absorb a difference between a thermal contraction of the coil support member 26 and that of the cooling member 30 in the radial direction.

The above-described flexible portions 55a to 55c, and 56a are not essential to the present invention. If the difference in the thermal contractions is small, the flexible portions may be omitted. For example, an upper lid 55 and a lower lid 56 may have shapes without the flexible portions 55a and 56a, and inner end surfaces of the upper and lower lids 55 and 56 in the radial direction may be directly abutted on and joined to the outer peripheral surface of the coil support member 26.

Figure 10:
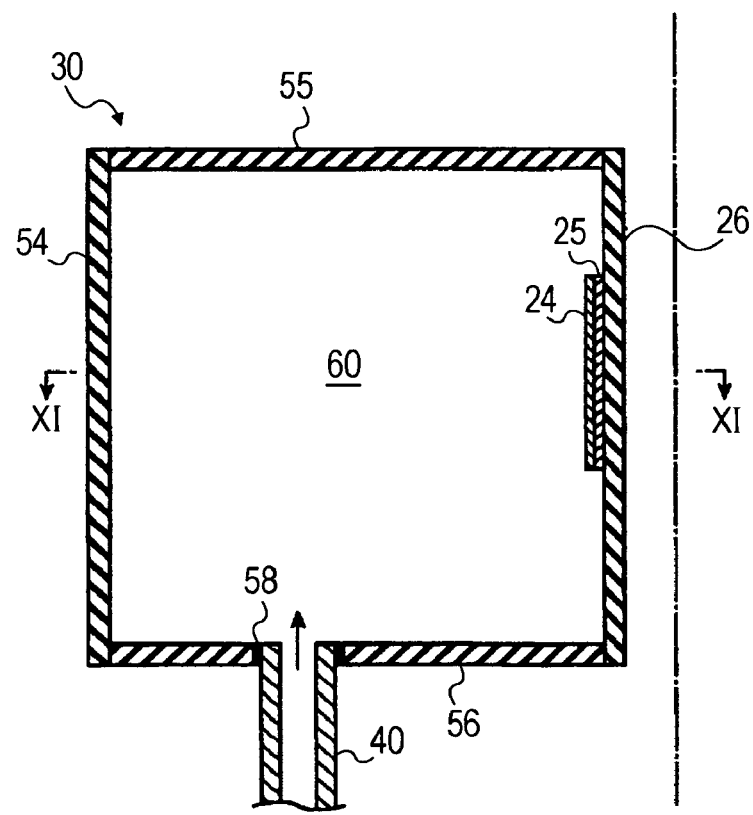
FIG. 10 is a sectional front view showing a fourth embodiment of a specific structure of the NMR probe head.
Figure 11:
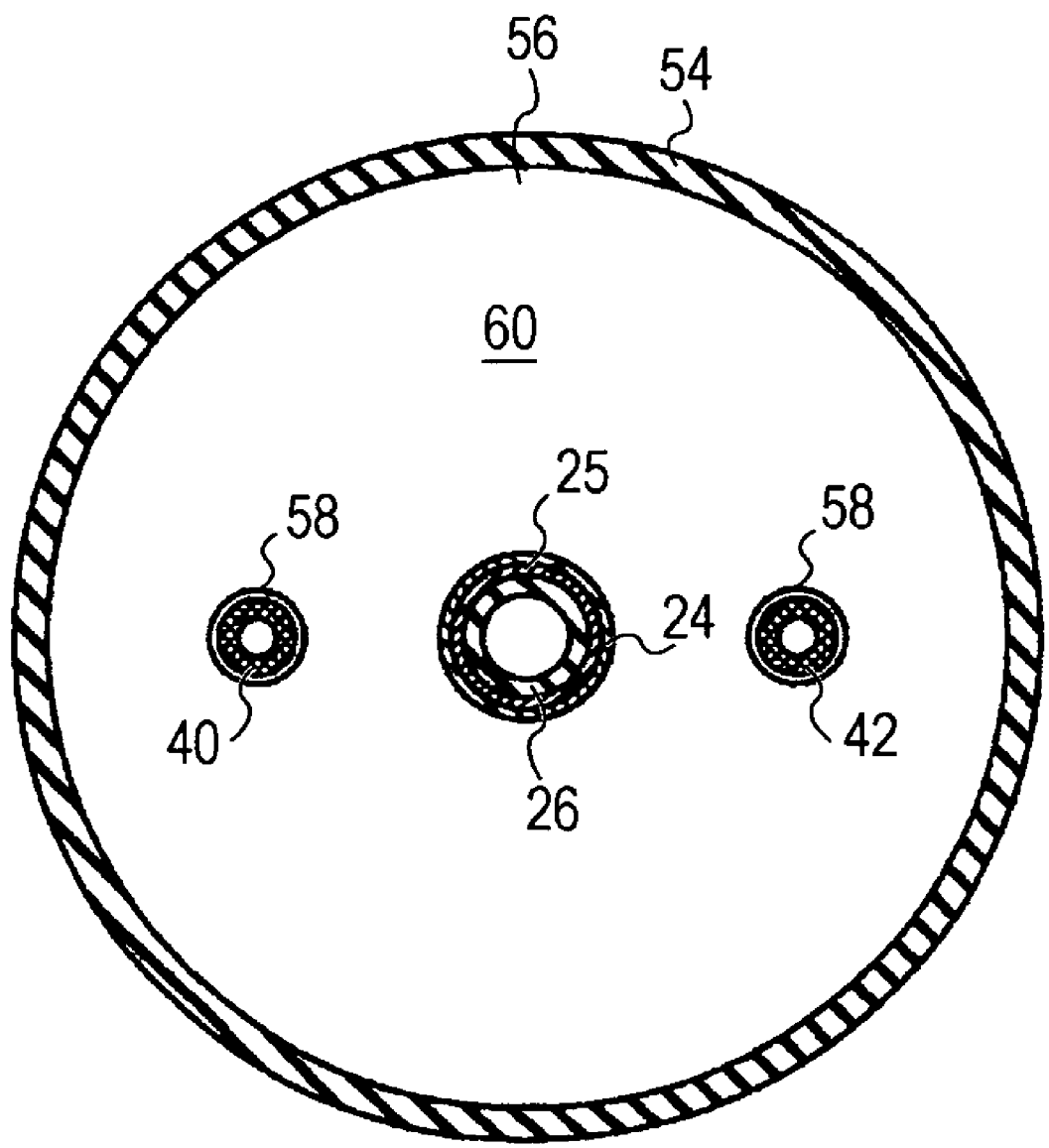
FIG. 11 is a sectional view taken along line XI-XI in FIG. 10.
Figure 12:
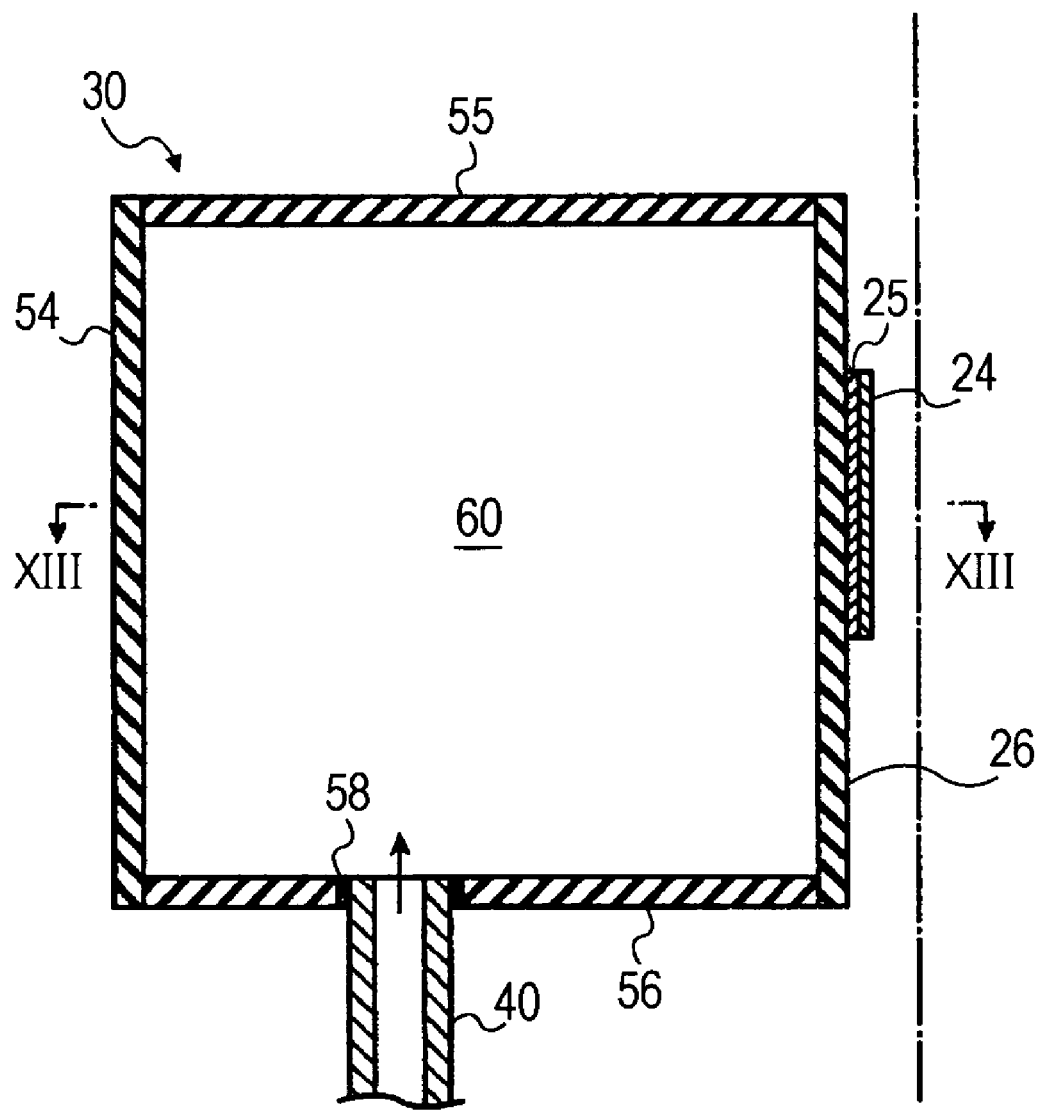
FIG. 12 is a sectional front view showing a fifth embodiment of a specific structure of the NMR probe head.
Figure 13:
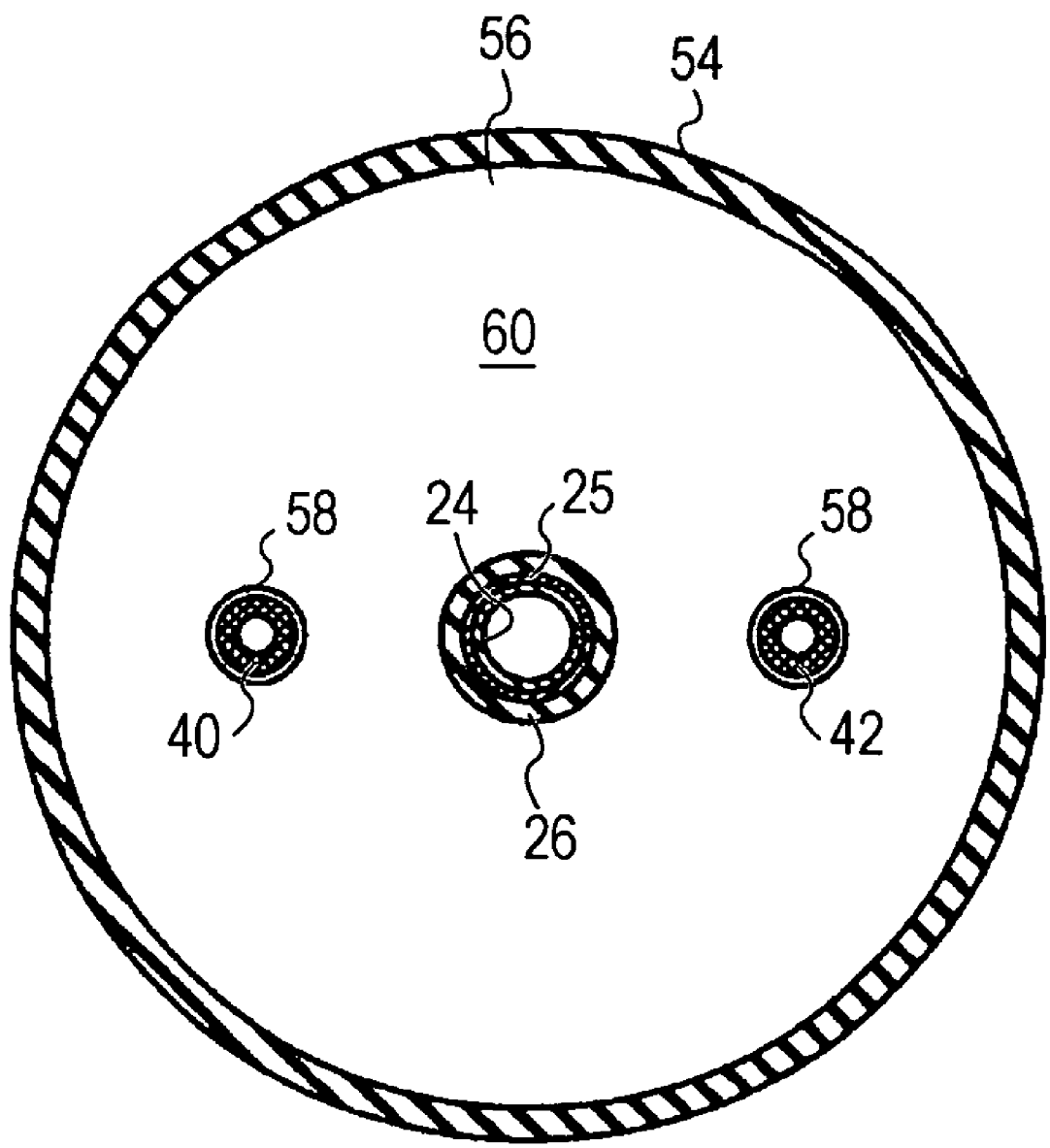
FIG. 13 is a sectional view taken along line XIII-XIII in FIG. 12.
Figure 14:
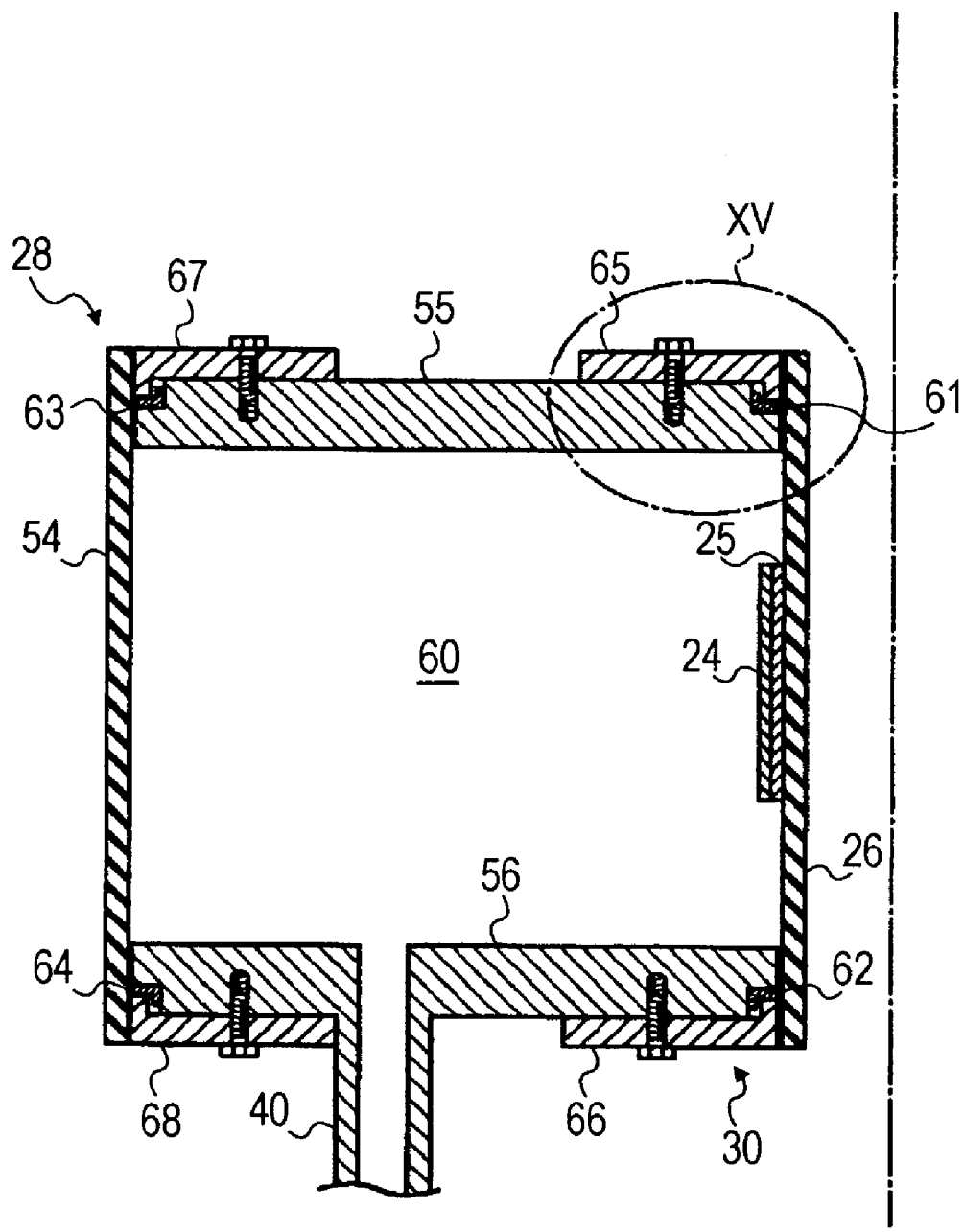
FIG. 14 is a sectional front view showing a sixth embodiment of a specific structure of the NMR probe head.
Figure 15:
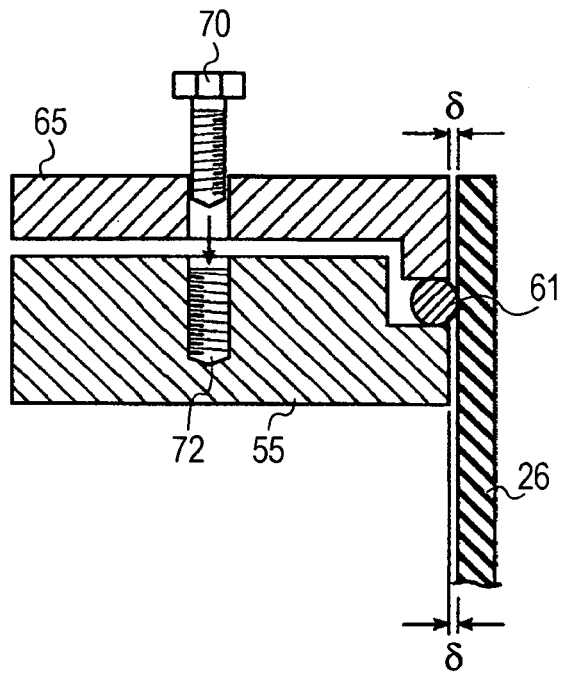
FIG. 15 is an enlarged view showing part XV in FIG. 14.

FIGS. 10 and 11 show a fourth embodiment. A cooling member 30 in this embodiment covers a coil support member 26 in an entire region in an axial direction. Similarly to the cooling member 30 shown in FIG. 3, the cooling member 30 includes an outer peripheral wall 54, an upper lid 55, and a lower lid 56. Inner end surfaces of the upper and lower lids 55 and 56 in the radial direction are respectively joined to an upper-end outer peripheral surface and a lower-end outer peripheral surface of the coil support member 26.

An antenna coil 24 in this embodiment is fixed to an intermediate portion in the axial direction of an outer peripheral surface of the coil support member 26. That is, the antenna coil 24 is fixed to a portion where the coil support member 26 is covered with the cooling member 30, and hence the antenna coil 24 is arranged in a cooling space 60.

Similarly to the coil support member 26, the cooling member 30 is formed of an insulating material that transmits electromagnetic waves, so as to prevent detection of an NMR signal with the antenna coil 24 from being adversely affected by the presence of the cooling member 30, in particular, the presence of the outer peripheral wall 54 located at the outside of the antenna coil 24 in the radial direction. Similarly to the coil support member 26, the material of the cooling member 30 is preferably a material with good thermal conductivity. More specifically, for example, the material may be preferably single-crystal sapphire, zirconia (ZrO2 or the like), quartz, or diamond. In particular, single-crystal sapphire is more preferable.

A refrigerant inlet tube 40 for introducing a refrigerant into the cooling space 60 and a refrigerant outlet tube 42 for discharging the refrigerant from the cooling space 60 are made of metal. Upper ends of both tubes 40 and 42 are joined to the lower lid 56 of the cooling member 30 with a joint material 58 such as an active silver-alloy.

The antenna coil 24 shown in FIGS. 10 and 11 is arranged in the cooling space 60, and hence directly contacts the refrigerant flowing through the cooling space 60. The refrigerant directly contacting the antenna coil 24 cools the antenna coil 24 further highly efficiently as compared with the antenna coil 24 arranged as shown in FIG. 3.

The portion of the coil support member 26 to support the antenna coil 24 is not particularly limited to the outer peripheral surface of the coil support member 26. In a fifth embodiment shown in FIGS. 12 and 13, the antenna coil 24 is fixed onto an inner peripheral surface of the coil support member 26. The antenna coil 24 illustrated in the drawings does not directly contact a refrigerant in a cooling space 60, however, since the antenna coil 24 is fixed onto the inner peripheral surface of the coil support member 26 at a portion directly contacting the refrigerant. Accordingly, the antenna coil 24 can be highly efficiently cooled.

The cooling member 30 does not have to be entirely made of an insulating material. At least a portion of the cooling member 30 located outside the antenna coil 24 in the radial direction may be made of an insulating material. A cooling member 30 according to a sixth embodiment shown in FIGS. 14 and 15 includes an outer peripheral wall 54, an upper lid 55, and a lower lid 56. The outer peripheral wall 54 is formed of an insulating material similar to the material of the coil support member 26, and the upper and lower lids 55 and 56 are formed of a metal material such as copper.

A sealing member 61 is interposed between an inner peripheral surface of the upper lid 55 and an outer peripheral surface of the coil support member 26. A sealing member 62 is interposed between an inner peripheral surface of the lower lid 56 and the outer peripheral surface of the coil support member 26. A sealing member 63 is interposed between an outer peripheral surface of the upper lid 55 and an inner peripheral surface of the outer peripheral wall 54. A sealing member 64 is interposed between an outer peripheral surface of the lower lid 56 and the inner peripheral surface of the outer peripheral wall 54. The sealing members 61 to 64 may be preferably made of, for example, indium.

The sealing member 61 is held between the upper lid 55 and a fixing plate 65. The sealing member 63 is held between the upper lid 55 and a fixing plate 67. The fixing plates 65 and 67 are engaged with an upper surface of the upper lid 55. Similarly, the sealing member 62 is held between the lower lid 56 and a fixing plate 66. The sealing member 64 is held between the lower lid 56 and a fixing plate 68. The fixing plates 66 and 68 are engaged with a lower surface of the lower lid 56. The upper and lower lids 55 and 56 are arranged between the coil support member 26 and the outer peripheral wall 54 with the sealing members 61 to 64 elastically deformed. The engagement of each of the fixing plates 65 to 68 relies on a combination of a bolt 70 shown in FIG. 15 and a screw hole 72 formed in one of the upper lid 55 and the lower lid 56. Very small gaps 6 are provided between the inner peripheral surfaces of the lids 55 and 56 and the outer peripheral surface of the coil support member 26, and between the outer peripheral surfaces of the lids 55 and 56 and the inner peripheral surface of the outer peripheral wall 54. The gaps are sealed with the sealing members 61 to 64.

Figure 16:
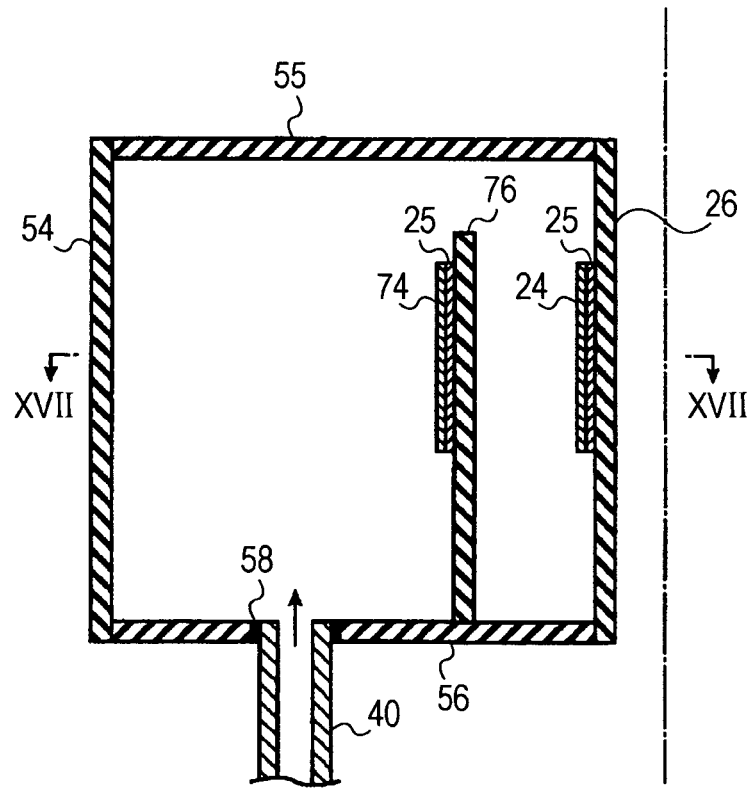
FIG. 16 is a sectional front view showing a seventh embodiment of a specific structure of the NMR probe head.
Figure 17:
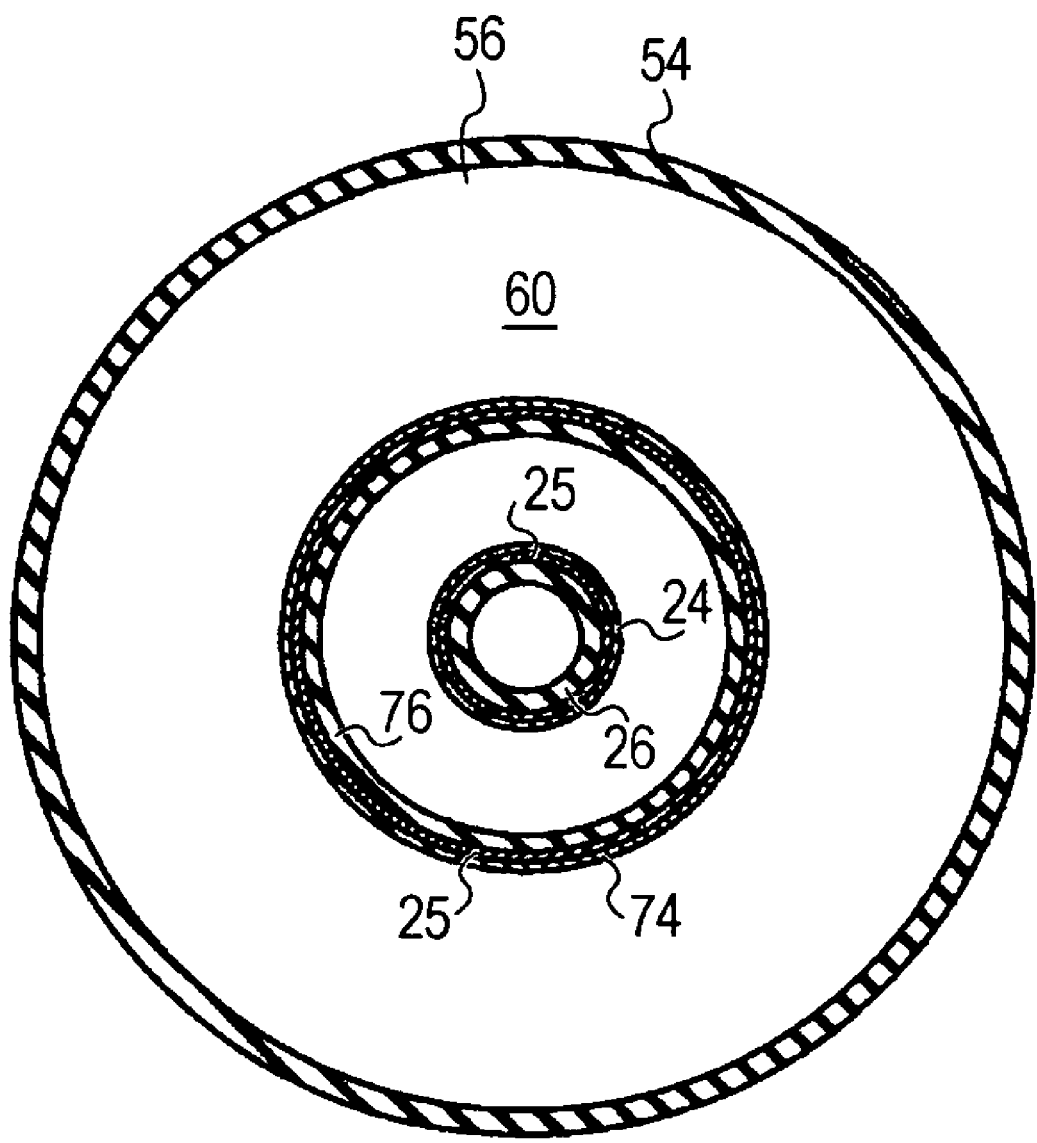
FIG. 17 is a sectional view taken along line XVII-XVII in FIG. 16.

In the present invention, the number of antenna coils is not particularly limited. The present invention may include a configuration in which a plurality of antenna coils are arrayed in the axial direction, and a configuration in which a plurality of antenna coils are coaxially arrayed in the radial direction. FIGS. 16 and 17 show a seventh embodiment as an example of the latter configuration.

An NMR probe head shown in FIGS. 16 and 17 is formed by adding another antenna coil 74 to the NMR probe head shown in FIG. 10. The antenna coil 74 has a larger diameter than the diameter of the antenna coil 24 shown in FIG. 10. The antenna coil 74 is arranged coaxially with the antenna coil 24 at a position outside the antenna coil 24 in the radial direction.

The antenna coil 74 is supported by a cylindrical coil support member 76. The coil support member 76 has a larger diameter than the diameter of the coil support member 26 shown in FIG. 10. The coil support member 76 is arranged in a cooling space 60 surrounded by the coil support member 26 and a cooling member 30. More specifically, the coil support member 26 is vertically arranged on the lower lid 56. The second antenna coil 74 is joined to an outer peripheral surface of an upper portion of the second coil support member 76 with a joint material 25.

Both the coil support members 26 and 76 are supported in the cooling space 60. Accordingly, a refrigerant flowing in the cooling space 60 directly contacts both the coil support members 26 and 76, thereby highly efficiently cooling the coil support members 26 and 76.

EXAMPLE

An NMR probe head shown in FIG. 3 is configured such that a coil support member 26 has an outer diameter of 10 mm and an inner diameter of 8 mm, a distance from a lower end of an antenna coil 24 to a lower surface of an upper lid 55 is 20 mm, and the material of the antenna coil 24 is aluminum. The NMR probe head is operated with a refrigerant at 4.2K.

In the operation, assuming that the antenna coil 24 generates heat with 1W per hour, the temperature of the antenna coil 24 is maintained at 5.9K or lower. A resistance of aluminum at this temperature is equivalent to a resistance of aluminum at 4.2K. Accordingly, impedance mismatching due to an increase in temperature of the antenna coil 24 during measurement is negligible.

As described above, the present invention provides a cooled NMR probe head which includes an antenna coil and detects an NMR signal while the antenna coil is cooled. The cooled NMR probe head includes a coil support member which supports the antenna coil, and a cooling member arranged around at least a portion of the coil support member, the cooling member providing a cooling space between the cooling member and the coil support member, the cooling space allowing a refrigerant to circulate therethrough. The cooling member is coupled to the coil support member such that the refrigerant flowing in the cooling space directly contacts an outer peripheral surface of the coil support member.

With the NMR probe head, the cooling space is provided between the coil support member and the cooling member, and the refrigerant circulating through the cooling space directly contacts the outer peripheral surface of the coil support member. Accordingly, the refrigerant highly efficiently exchanges heat with the coil support member, thereby effectively cooling the antenna coil supported by the coil support member. The cooling effectively decreases the operation temperature of the antenna coil, thereby increasing detection sensitivity of an NMR signal. With the increase in the detection sensitivity, an NMR analyzer with extremely high precision can be provided.

At least a portion of the coil support member, the portion which supports the antenna coil, may be preferably formed of at least one material selected from the group consisting of single-crystal sapphire, zirconia, quartz, and diamond. These materials have highly electrically insulating properties, thereby hardly affecting the detection of the NMR signal with the antenna coil. Moreover, these materials have high thermal conductivities, thereby promoting the effective cooling of the antenna coil.

The shape of the coil support member and the shape of the cooling member are appropriately determined. For example, the coil support member may be preferably cylindrical, and the cooling member may preferably have a shape covering at least a portion of the outer peripheral surface of the coil support member in the axial direction to extend along the entire periphery from at least the outside in the radial direction.

More specifically, the cooling member may preferably include an outer peripheral wall and upper and lower lids, the outer peripheral wall being arranged outside the coil support member in the radial direction and surrounding at least a portion of the coil support member, the upper and lower lids covering a space defined between an inner surface of the outer peripheral wall and the outer peripheral surface of the coil support member from upper and lower sides of the space, inner ends of the upper and lower lids being coupled onto an outer peripheral surface of the coil support member.

The cooling member may preferably include a flexible portion capable of being bent in the radial direction of the coil support member, the flexible portion being joined to the coil support member. The bending of the flexible portion absorbs the difference between a thermal contraction of the coil support member and that of the cooling member in the radial direction, and effectively prevents a thermal stress from being generated due to the difference in the thermal contractions.

For the positional relationship between the cooling member and the antenna coil, the cooling member may have a shape covering a portion of the coil support member in the axial direction, and the antenna coil may be fixed onto the outer peripheral surface of the coil support member at a portion deviated from the portion covered with the cooling member in the axial direction. Alternatively, the antenna coil may be fixed to a portion of the coil support member covered with the cooling member. In the former case, for example, a maintenance process for an antenna coil is easily performed. In the latter case, since the antenna coil is fixed to the portion of the coil support member, the portion which directly contacts the refrigerant, the antenna coil is efficiently cooled.

Further, the antenna coil may be fixed onto the outer peripheral surface of the coil support member at a portion covered with the cooling member at a position where the antenna coil can directly contact the refrigerant.

With the configuration, since the antenna coil directly contacts the refrigerant, the temperature of the antenna coil can be further effectively decreased.

A portion of the cooling member located outside the antenna coil in the radial direction may be preferably formed of at least one material selected from the group consisting of single-crystal sapphire, zirconia, quartz, and diamond. The cooling member formed of any of these materials hardly affects detection of an NMR signal.

In addition, the present invention provides an NMR analyzer including the cooled NMR probe head with any of the above-described configurations, a superconducting coil provided around the NMR probe head, and a cryogenic container which contains the superconducting coil. With the NMR analyzer, the high detection sensitivity for an NMR signal of the NMR probe head enables NMR analysis with high precision.

The invention claimed is:

1. A cooled NMR probe head which includes an antenna coil and detects an NMR signal while the antenna coil is cooled, the cooled NMR probe head, comprising:
   a coil support member which supports the antenna coil;
   wherein the coil support member is cylindrical, and
   a cooling member arranged around at least a portion of the coil support member, the cooling member providing a cooling space between the cooling member and the coil support member, the cooling space allowing a refrigerant to circulate therethrough,
   wherein the cooling member is coupled to the coil support member such that the refrigerant flowing in the cooling space directly contacts an outer peripheral surface of the coil support member, and
   wherein the cooling member has a shape covering at least a portion of the outer peripheral surface of the coil support member in an axial direction to extend along the entire periphery from at least the outside in a radial direction.

2. The cooled NMR probe head according to claim 1, wherein the cooling member includes an outer peripheral wall and upper and lower lids, the outer peripheral wall being arranged outside the coil support member in the radial direction and surrounding at least a portion of the coil support member, the upper and lower lids covering a space defined between an inner surface of the outer peripheral wall and the outer peripheral surface of the coil support member from upper and lower sides of the space, inner ends of the upper and lower lids being coupled onto the outer peripheral surface of the coil support member.

3. The cooled NMR probe head according to claim 1, wherein the cooling member includes a flexible portion capable of being bent in the radial direction of the coil support member, the flexible portion being joined to the coil support member.

4. The cooled NMR probe head according to claim 1,
   wherein the cooling member has a shape covering a portion of the coil support member in the axial direction, and
   wherein the antenna coil is fixed onto the outer peripheral surface of the coil support member at a portion deviated from the portion covered with the cooling member in the axial direction.

5. The cooled NMR probe head according to claim 1, wherein the antenna coil is fixed to a portion of the coil support member covered with the cooling member.

6. The cooled NMR probe head according to claim 5, wherein the antenna coil is fixed onto the outer peripheral surface of the coil support member at the portion covered with the cooling member at a position where the antenna coil can directly contact the refrigerant flowing in the cooling space.

7. The cooled NMR probe according to claim 5, wherein a portion of the cooling member located outside the antenna coil in the radial direction is formed of at least one material selected from the group consisting of single-crystal sapphire, zirconia, quartz, and diamond.

8. The cooled NMR probe head according to claim 1,
   wherein at least a portion of the coil support member, the portion which supports the antenna coil, is formed of at least one material selected from the group consisting of single-crystal sapphire, zirconia, quartz, and diamond.

9. An NMR analyzer, comprising:
   a cooled NMR probe head which includes an antenna coil and detects an NMR signal while the antenna coil is cooled, the cooled NMR probe head comprising:
   a coil support member which supports the antenna coil; and
   wherein the coil support member is cylindrical; and
   a cooling member arranged around at least a portion of the coil support member,
   the cooling member providing a cooling space between the cooling member and the coil support member, the cooling space allowing a refrigerant to circulate therethrough,
   wherein the cooling member is coupled to the coil support member such that the refrigerant flowing in the cooling space directly contacts an outer peripheral surface of the coil support member; and
   wherein the cooling member has a shape covering at least a portion of the outer peripheral surface of the coil support member in an axial direction to extend along the entire periphery from at least the outside in a radial direction;
   a superconducting coil provided around the NMR probe head; and
   a cryogenic container which contains the superconducting coil.

* * * * *